United States Patent
Ruhland

(10) Patent No.: US 11,289,620 B2
(45) Date of Patent: Mar. 29, 2022

(54) METHOD OF PRODUCING OPTOELECTRONIC SEMICONDUCTOR CHIPS AND OPTOELECTRONIC SEMICONDUCTOR CHIP

(71) Applicant: OSRAM OLED GmbH, Regensburg (DE)

(72) Inventor: Michael Ruhland, Hemau (DE)

(73) Assignee: OSRAM OLED GMBH, Regensburg (DE)

( * ) Notice: Subject to any disclaimer, the term of this patent is extended or adjusted under 35 U.S.C. 154(b) by 36 days.

(21) Appl. No.: 16/622,878

(22) PCT Filed: Jun. 13, 2018

(86) PCT No.: PCT/EP2018/065698
§ 371 (c)(1),
(2) Date: Dec. 13, 2019

(87) PCT Pub. No.: WO2018/234124
PCT Pub. Date: Dec. 27, 2018

(65) Prior Publication Data
US 2020/0212254 A1    Jul. 2, 2020

(30) Foreign Application Priority Data
Jun. 23, 2017  (DE) .......................... 102017113949.4

(51) Int. Cl.
*H01L 33/00*  (2010.01)
*H01L 33/48*  (2010.01)
*H01L 33/62*  (2010.01)

(52) U.S. Cl.
CPC ........ *H01L 33/0095* (2013.01); *H01L 33/486* (2013.01); *H01L 33/62* (2013.01)

(58) Field of Classification Search
CPC .......... H01L 21/78–786; H01L 27/156; H01L 33/0095; H01L 33/62
See application file for complete search history.

(56) References Cited

U.S. PATENT DOCUMENTS 4,729,971 A    3/1988  Coleman
9,048,383 B2   6/2015  Mayer et al.
(Continued)

FOREIGN PATENT DOCUMENTS

DE    102010026518 A1    1/2012
DE    102011011862 A1    8/2012
(Continued)

OTHER PUBLICATIONS

Disco Corporation, "Laser Application," http://www.disco.co.jp/eg/products/catalog/pdf/dfl7000.pdf, Nov. 25, 2010, pp. 1-8.

*Primary Examiner* — Nicholas J Tobergte
(74) *Attorney, Agent, or Firm* — Slater Matsil, LLP

(57) ABSTRACT

A method for producing optoelectronic semiconductor chips and an optoelectronic semiconductor chip are disclosed. In an embodiment a method includes growing a semiconductor layer sequence with an active, attaching a carrier substrate, depositing a sacrificial layer on an outer side of the carrier substrate and/or of the growth substrate, structuring the sacrificial layer so that singulation lanes are formed and dividing the carrier substrate and/or the growth substrate along the singulation lanes by a singulation stream including a laser radiation or a plasma, wherein the sacrificial layer adjacent to the singulation lanes is not transmissive to the singulation stream, and wherein the singulation stream is passed both through the singulation lanes and over the sacrificial layer.

20 Claims, 5 Drawing Sheets

(56) References Cited

U.S. PATENT DOCUMENTS

| | | | |
|---|---|---|---|
| 9,196,536 B1 * | 11/2015 | Park | B23K 26/36 |
| 9,263,334 B2 | 2/2016 | Weiss et al. | |
| 2005/0130390 A1 | 6/2005 | Andrews et al. | |
| 2011/0260205 A1 | 10/2011 | Moosburger et al. | |
| 2013/0221392 A1 | 8/2013 | Engl et al. | |
| 2013/0240919 A1 * | 9/2013 | Park | H01L 25/0753 |
| | | | 257/88 |
| 2015/0270454 A1 | 9/2015 | Lee et al. | |
| 2017/0148697 A1 * | 5/2017 | Kamphuis | H01L 29/0657 |

FOREIGN PATENT DOCUMENTS

| | | |
|---|---|---|
| DE | 102011054891 A1 | 5/2013 |
| WO | 2014052445 A1 | 4/2014 |

\* cited by examiner

METHOD OF PRODUCING OPTOELECTRONIC SEMICONDUCTOR CHIPS AND OPTOELECTRONIC SEMICONDUCTOR CHIP

This patent application is a national phase filing under section 371 of PCT/EP2018/065698, filed Jun. 13, 2018, which claims the priority of German patent application 102017113949.4, filed Jun. 23, 2017, each of which is incorporated herein by reference in its entirety.

TECHNICAL FIELD

A method of producing optoelectronic semiconductor chips is specified. In addition, an accordingly produced optoelectronic semiconductor chip is specified.

SUMMARY OF THE INVENTION

Embodiments provide a method by which semiconductor chips can be efficiently singulated from a wafer composite.

According to at least one embodiment, the method serves to produce optoelectronic semiconductor chips. Semiconductor chips are, for example, light emitting diode chips, laser diode chips or superluminescence diode chips. Light emitting diode chips, or LED chips for short, are preferably produced.

According to at least one embodiment, the method comprises the step of growing a semiconductor layer sequence onto a growth substrate. The semiconductor layer sequence comprises at least one active zone for radiation generation. The radiation generated during operation of the finished semiconductor chips in the active zone is in particular near ultraviolet radiation, visible light or near infrared radiation. The preferred wavelength of maximum intensity of the radiation generated is at least 360 nm or 405 nm and/or at most 1000 nm or 720 nm or 520 nm. Preferably, the active zone is configured for generating blue light.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or such as $Al_nGa_mIn_{1-n-m}As_kP_{1-k}$, where in each case $0 \leq n \leq 1$, $0 \leq m \leq 1$ and $n+m \leq 1$ as well as $0 \leq k < 1$. Preferably, $0 < n \leq 0.8$, $0.4 \leq m < 1$ and $n+m \leq 0.95$ as well as $0 < k \leq 0.5$ apply to at least one layer or to all layers of the semiconductor layer sequence. The semiconductor layer sequence may contain dopants and additional components. For the sake of simplicity, however, only the essential components of the crystal lattice of the semiconductor layer sequence are indicated, i.e., Al, As, Ga, In, N or P, even if these may be partially replaced and/or supplemented by small quantities of other substances. The semiconductor layer sequence is preferably based on the AlInGaN material system.

According to at least one embodiment, the method comprises the step of attaching a carrier substrate to the semiconductor layer sequence. The carrier substrate can be a temporary or a permanent carrier. In the case of a permanent carrier, the carrier substrate, especially the singulated carrier substrate, is found in the finished semiconductor chips. In this case, the carrier substrate is preferably the mechanically stabilizing and supporting component of the finished semiconductor chips.

According to at least one embodiment, the carrier substrate is attached to a top of the semiconductor layer sequence facing away from the growth substrate. This means, for example, that the semiconductor layer sequence is at least temporarily located between the growth substrate and the carrier substrate. Alternatively, it is possible to attach the carrier substrate or a further carrier to a side of the growth substrate remote from the semiconductor layer sequence.

According to at least one embodiment, a sacrificial layer is applied to a side of the carrier substrate and/or the growth substrate and/or the further carrier facing away from the semiconductor layer sequence. The sacrificial layer serves to divide the carrier substrate and/or the growth substrate. It is possible that the sacrificial layer is limited to this function. Alternatively, the sacrificial layer may perform further functions.

According to at least one embodiment, the sacrificial layer is structured so that singulation lanes are formed. In the singulation lanes a material of the sacrificial layer is predominantly or completely removed. For example, predominantly means a thickness reduction of at least 60% or 80% or 90%.

According to at least one embodiment, the method comprises the step of dividing the carrier substrate and/or the growth substrate. The dividing takes place along the separation lanes. In other words, separation paths are defined by the singulation lanes along which the dividing and/or singulation to the semiconductor chips takes place.

According to at least one embodiment, the dividing and/or singulation takes place by means of a singulation stream. The singulation stream is a luminous flux or gas flux, especially laser radiation and/or plasma. In particular, the dividing takes place via laser ablation, laser evaporation, laser melting or so-called stealth dicing and alternatively or additionally via a plasma process such as plasma cutting or reactive ion etching, in short RIE. In addition, a mechanical process such as breaking or a chemical process such as etching may be used.

According to at least one embodiment, the sacrificial layer adjacent to the separation lanes is not transmissive to the separation stream. This means that the sacrificial layer is retained in a finite thickness when the singulation stream is directed to areas adjacent to the singulation lanes.

According to at least one embodiment, the singulation stream is guided both through the singulation lanes and over the sacrificial layer. This means that the singulation stream is not only directed along the singulation lanes, but especially between neighboring sections of the singulation lanes also over the sacrificial layer itself. The material can be removed from the sacrificial layer, whereby the sacrificial layer remains adjacent to the singulation lanes preferably as a continuous layer.

In at least one embodiment, the method is configured for producing optoelectronic semiconductor chips and comprises the following steps, preferably in the specified sequence:

A) growing a semiconductor layer sequence having an active region for radiation generation on a growth substrate, B) attaching a carrier substrate, in particular to a top of the semiconductor layer sequence facing away from the growth substrate, C) depositing a sacrificial layer on an outer side of the carrier substrate and/or the growth substrate facing away from the semiconductor layer sequence, D) structuring the sacrificial layer so that singulation lanes are formed, and E) dividing the carrier substrate and/or the growth substrate along the singulation paths to the semiconductor chips by means of a singulation stream, wherein the singulation stream preferably comprises or is a laser radiation or a plasma and the sacrificial layer adjacent the singulation paths is not transmissive to the singulation stream so that the singulation stream is passed both through the singulation paths and across the sacrificial layer.

With the method described here, it is possible to efficiently separate semiconductor chips from a wafer composite using a multi-beam laser system, whereby, seen from above, chip geometries can be efficiently produced deviating from a rectangular or square shape. The singulation stream, in particular the laser radiation, does not have to be switched off at the chip edges. The singulation stream can be guided continuously and with several beam bundles or partial beams without damaging the semiconductor layer sequence.

This is made possible in particular by the use of the sacrificial layer, which has a sufficient thickness as a cutting mask made of material that is difficult or impossible to cut. The at least one material for the sacrificial layer is deposited by a deposition process such as vapor deposition or electroplating on a front side and/or back side of the carrier substrate and/or the growth substrate and opened at the later cutting edges for the semiconductor chips by an etching process. These open areas form the cutting mask for the singulation stream during the subsequent singulation. The sacrificial layer can be removed by processes such as etching or laser lift off or can optionally remain on the singulated semiconductor chips. This makes it possible to produce individual chip contours with a high throughput of the separation system and low loss of adjacent chips.

According to at least one embodiment, the singulation stream, which is preferably a focused laser radiation, is divided into several partial beams. The partial beams are preferably guided along a common straight line over the growth substrate and/or the carrier substrate. It is possible that the individual partial beams are identical within the production tolerances and process tolerances, i.e., have the same intensities and/or the same focus diameter.

The partial beams follow each other sequentially along a singulation line, so that each point of the singulation line is irradiated sequentially by each of the partial beams and a stepwise material removal and/or material modification takes place sequentially with each partial beam in the growth substrate and/or the carrier substrate. Thus the dividing of the carrier substrate is carried out not only with a single beam, but step by step through the successive partial beams. Thus, the singulation stream is formed by a beam fan which is guided along the respective separation line. For example, the separation stream comprises a fan with at least four or six or ten partial beams. Alternatively or additionally, the number of partial beams is not more than 40 or 30 or 20.

According to at least one embodiment, the sacrificial layer is a metallic layer. The sacrificial layer is preferably reflective for the singulation stream, in particular for the laser radiation. Reflective means, for example, a reflectance of at least 60% or 80% or 90% for the singulation stream.

According to at least one embodiment, the sacrificial layer is composed of one or more metallic layers. The at least one metallic layer of the sacrificial layer preferably comprises or consists of one or more of the following materials: molybdenum, aluminum, copper, nickel, a solder such as a gold-tin solder.

According to at least one embodiment, the sacrificial layer has a thickness of at least 1 µm or 2 µm or 3 µm or 6 µm. Alternatively or additionally, the thickness of the sacrificial layer is at most 200 µm or 50 µm or 15 µm. Preferably, the sacrificial layer is thinner than the carrier substrate and/or the growth substrate. It is possible that the sacrificial layer is thicker than the semiconductor layer sequence.

According to at least one embodiment, the sacrificial layer is applied in step C) with a constant thickness throughout. Thus, the sacrificial layer is preferably applied unstructured.

According to at least one embodiment, the sacrificial layer in step D) is at least 90% or completely removed in the area of the singulation lanes. By structuring the sacrificial layer, the growth substrate and/or the carrier substrate can be exposed in places.

According to at least one embodiment, the sacrificial layer becomes thinner in places in step E) adjacent to the singulation lanes. In particular, in step E) one or more grooves are formed which are produced by the singulation stream and which, seen from above, preferably cross the sacrificial layer completely, i.e., extend from one singulation lane continuously to another singulation lane, these singulation lanes framing the corresponding partial region of the sacrificial layer.

According to at least one embodiment, some or all of the singulation lanes have one or more bends when viewed from above. Unlike the singulation lines, the singulation lanes are not formed by straight lines.

According to at least one embodiment, the finished semiconductor chips have the shape of polygons when viewed from above. In particular, the semiconductor chips have at least five or six corners when viewed from above. Seen from above, semiconductor chips are preferably hexagons, especially regular hexagons.

According to at least one embodiment, in step E) the growth substrate and/or the carrier substrate are predominantly or completely divided by the singulation stream. Predominantly means, for example, that the separation stream penetrates and/or divides and/or modifies the thickness of the growth substrate and/or carrier substrate by at least 70% or 85% or 95%. If the growth substrate and/or carrier substrate in step E) is only incompletely divided by the singulation stream, the complete dividing takes place, for example, by etching and/or breaking.

According to at least one embodiment, an edge of the singulation lanes has one or more roundings. In step E), the separation flow can be partially or completely dispersed by the at least one rounding when leaving the separation lanes. This avoids damage to the semiconductor layer sequence when the singulation stream leaves the separation lanes.

According to at least one embodiment, electrical contact structures are located on an inner side of the carrier substrate and/or the growth substrate facing the semiconductor layer sequence. The finished semiconductor chips, especially the semiconductor layer sequence, can be electrically contacted via the contact structures. The electrical contact structures are, for example, conductor tracks and/or soldering surfaces to which bond wires are attachable.

According to at least one embodiment, in step E), the contact structures are divided by the singulation stream. The dividing by means of the singulation stream is therefore not necessarily limited to the growth substrate and/or the carrier substrate.

According to at least one embodiment, the semiconductor layer sequence and/or the growth substrate are structured in a step preceding step E). In particular, the structuring of the semiconductor layer sequence and/or the growth substrate is then carried out by means of etching.

According to at least one embodiment, the growth substrate is a permanent carrier of the finished semiconductor chips. The dividing in step E) is preferably carried out by means of a focused laser radiation. If the carrier substrate is a permanent carrier, the growth substrate is preferably partially or completely removed from the semiconductor layer sequence, in particular by etching or by means of a laser lift-off process or LLO for short.

According to at least one embodiment, a lateral distance of the semiconductor layer sequence from the singulation lanes, viewed from above, in step E) is at least 60% or 120% or 180% of an average width of the singulation lanes. Such a comparatively large distance between the semiconductor layer sequence and the singulation lanes avoids damage to the semiconductor layer sequence by the singulation stream.

According to at least one embodiment, at least one protective layer is applied before step E) at least on side surfaces of the semiconductor layer sequence. The protective layer is designed, for example, to protect the semiconductor layer sequence from the singulation stream. In addition to the side surfaces, a side of the semiconductor layer sequence facing away from the growth substrate and/or the carrier substrate can be provided with the protective layer.

The protective layer can be a temporary protective layer specially designed for step E). For example, the protective layer is then a photoresist that can subsequently be completely removed. Alternatively, the protective layer can remain permanently on the semiconductor layer sequence. Then the protective layer is preferably made of a radiation-transmissive material such as an oxide or nitride, in particular silicon dioxide. A thickness of such a protective layer is preferably at least 200 nm or 400 nm, and can also be thicker than conventional protective layers with thicknesses in the range between 50 nm and 150 nm.

It is also possible that a permanent or temporary protective layer reflects radiation, especially radiation generated in the semiconductor layer sequence during operation and/or the laser radiation of the singulation stream. In this case, the protective layer is, for example, a metal layer or includes such a layer. This allows the semiconductor layer sequence to be reflectively protected from the singulation stream. Otherwise, the protective layer serves primarily to keep slag or other material components released in step E) away from the semiconductor layer sequence.

According to at least one embodiment, the growth substrate and/or carrier substrate is made of or comprises one or more of the following materials: semiconductor material such as silicon or germanium, a ceramic, a glass, sapphire, silicon carbide, gallium nitride.

According to at least one embodiment, after step E), the sacrificial layer is completely removed from the support substrate and/or from the growth substrate. The sacrificial layer is thus no longer present in the finished semiconductor chips. Alternatively, the sacrificial layer may still be partially or completely present in the finished semiconductor chips.

In addition, an optoelectronic semiconductor chip is specified. In particular, the semiconductor chip is produced using a method as described in conjunction with one or more of the above embodiments. Features of the method are therefore also disclosed for the semiconductor chip and vice versa.

In at least one embodiment of the semiconductor chip, the semiconductor layer sequence with the active zone is located on the carrier substrate, whereby the carrier substrate can be formed by a growth substrate of the semiconductor layer sequence or by a replacement carrier. The sacrificial layer is attached to an outer side of the carrier substrate facing away from the semiconductor layer sequence. The sacrificial layer and/or the semiconductor layer sequence are set back in cross-section from the carrier side surfaces of the carrier. The sacrificial layer has one or more grooves. The at least one groove, in particular the exactly one groove or the exactly two grooves, only partially penetrate the sacrificial layer in the direction of the carrier substrate. Furthermore, the at least one groove, seen from above, completely crosses the sacrificial layer on the carrier substrate.

According to at least one embodiment, the sacrificial layer is a solder layer. The sacrificial layer can be composed of one or more solders. In this case, the sacrificial layer is especially preferred for the attachment of the semiconductor chips. The semiconductor chip can be surface mountable.

BRIEF DESCRIPTION OF THE DRAWINGS

In the following, a method described here and a semiconductor chip described here are explained in more detail with reference to the drawing on the basis of exemplary embodiments. The same reference signs indicate the same elements in the individual figures. However, there are no true-to-scale references represented, rather individual elements can be exaggeratedly large represented for the sake of better understanding.

In the Figures.

DETAILED DESCRIPTION OF ILLUSTRATIVE EMBODIMENTS

Figure 1A:
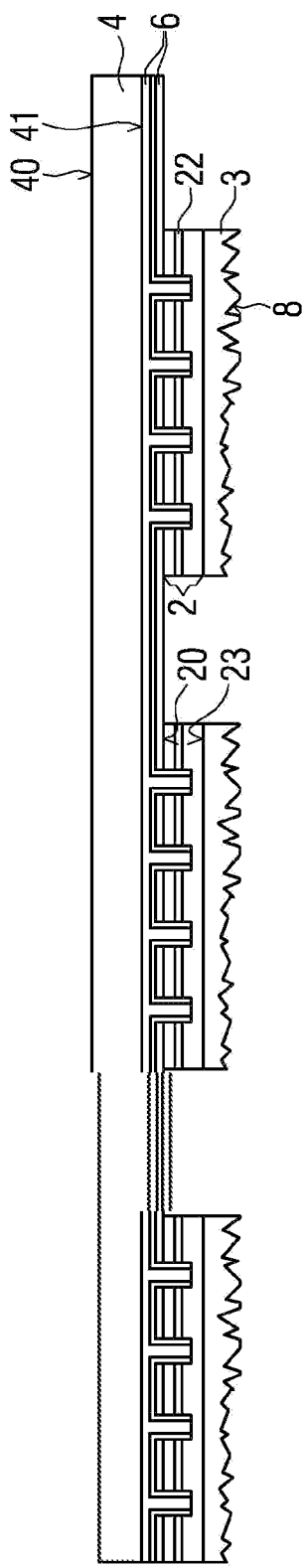
FIGS. 1A-1G, FIG. 4, FIGS. 5A-5B and FIG. 6 show schematic sectional views and perspective top views of the method steps for the production of optoelectronic semiconductor chips.

FIG. 1 illustrates a method for producing optoelectronic semiconductor chips 1. According to FIG. 1A, a semiconductor layer sequence 2 with an active zone 22 is epitaxially grown on a growth substrate 3 for radiation generation. For the electrical contacting of the semiconductor layer sequence 2, electrical contact structures 6 are present, which can at least partially penetrate the active zone 22. Especially after the generation of the contact structures 6, the semiconductor layer sequence 2 and the growth substrate 3 are structured to several areas for the later semiconductor chips 1. The contact structures 6 are exposed around the individual areas of the semiconductor layer sequence 2. Optionally, the growth substrate 3 is partially removed and provided with a roughening 8. The growth substrate 2 is located on an underside 23 of the semiconductor layer sequence 2.

The structuring of the semiconductor layer sequence 2 and the generation of the roughening 8 are preferably performed after the semiconductor layer sequence 2 and the contact structures 6 have been attached to a carrier substrate 4. The carrier substrate 4 is preferably a permanent carrier for the finished semiconductor chips 1. The carrier substrate 4, for example, is a silicon carrier. The semiconductor layer sequence 2 with the contact structures 6 is located on an inner side 41. An outer side 40 of the carrier substrate 4 faces away from the semiconductor layer sequence 2. According to FIG. 1A, the individual areas of the semiconductor layer sequence 2 are mechanically stabilized and held by the carrier substrate 4.

Figure 1B:
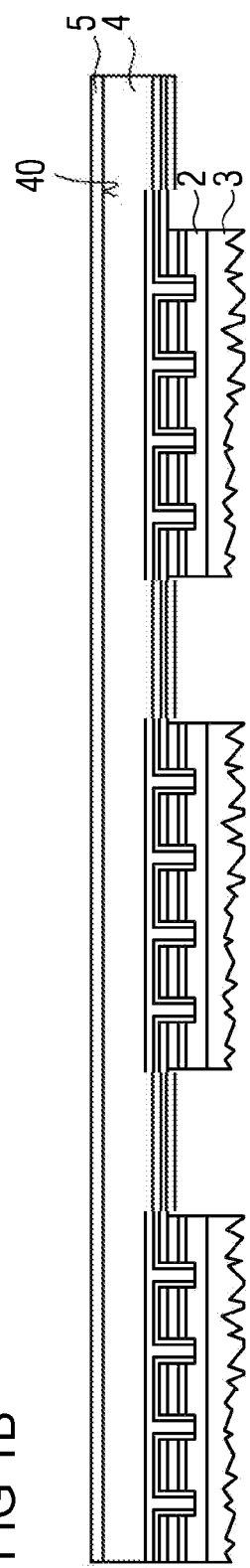

FIG. 1B shows that a sacrificial layer 5 is continuously applied to the outer side 40. For example, sacrificial layer 5 is a molybdenum layer with a thickness of 3 µm.

Figure 1C:
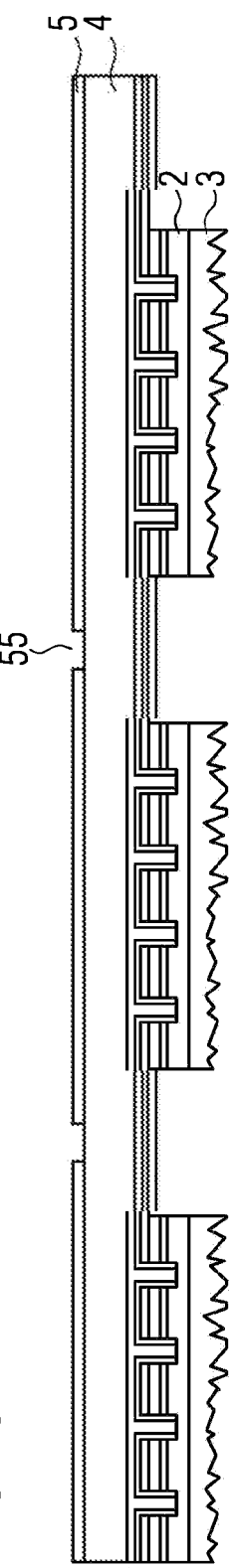

In the method step of FIG. 1C, several singulation lanes 55 are formed in the sacrificial layer 5. This is done, for example, by etching. The carrier substrate 4 is preferably not affected or not significantly affected. In other words, as shown in FIG. 1C, the structuring is preferably limited to the sacrificial layer 5.

Figure 1D:
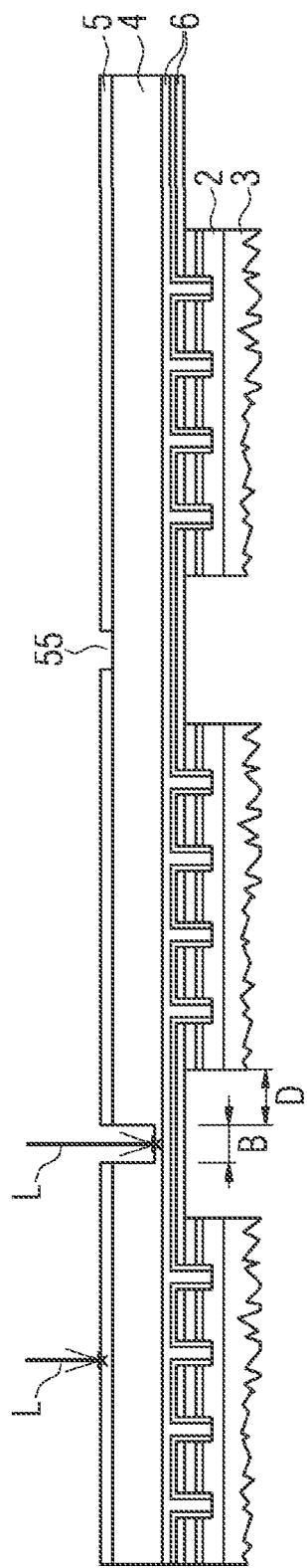

FIG. 1D illustrates that the carrier 4 is divided by means of a laser radiation L via the singulation lanes 55. As an alternative to a laser radiation L, plasma cutting can also be used. The laser radiation L is guided through the singulation lanes 55 and in certain areas also over the remaining areas of the sacrificial layer 5. The sacrificial layer 5 located adjacent to the singulation lanes itself is not transmissive to the laser radiation L.

A width B of the singulation lanes 55, for example, is at least 2 μm and/or at most 10 μm, in particular around 5 μm. The width B of the singulation lanes 55 exceeds a focal diameter of the laser radiation L, for example, by at least a factor of 1.5 or 2 and/or by at most a factor of 5 or 3. In deviation from the illustration in FIG. 1D, it is thus possible that the carrier substrate 4 is not removed over the entire width of the singulation lanes 55.

A distance D of the semiconductor layer sequence 2 from the singulation lanes 55, for example, is at least 2 μm or 5 μm and/or at most 30 μm or 15 μm, in particular approximately 10 μm.

In contrast to FIG. 1D, the laser radiation L preferentially penetrates the carrier substrate 4 completely and also preferentially the contact structures 6. If the carrier substrate 4 is not completely divided with the laser radiation L, a complete dividing can subsequently take place by breaking or stretching.

Figure 1E:
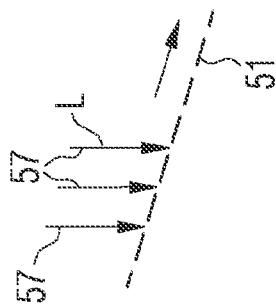

The laser radiation L is preferably a fan of several partial beams 57, see FIG. 1E. The partial beams 57 are guided one after the other along a straight singulation line 51. Due to the fan-like design of the laser radiation L with a large number of partial beams 57, the singulation line 51 can only be curved or kink-shaped to a very limited extent, in contrast to a single beam. A direction of movement of the partial beams 57 is symbolized in FIG. 1E by an arrow parallel to the singulation line 51.

The laser radiation L has a wavelength of maximum intensity of 355 nm, for example. The laser radiation L is preferably pulsed laser radiation with a pulse length of a few nanoseconds. Alternatively, infrared laser radiation L is used, for example, with a wavelength of approximately 1.06 μm or of approximately 10 μm, in particular with an average power of around 20 W.

Figure 1F:
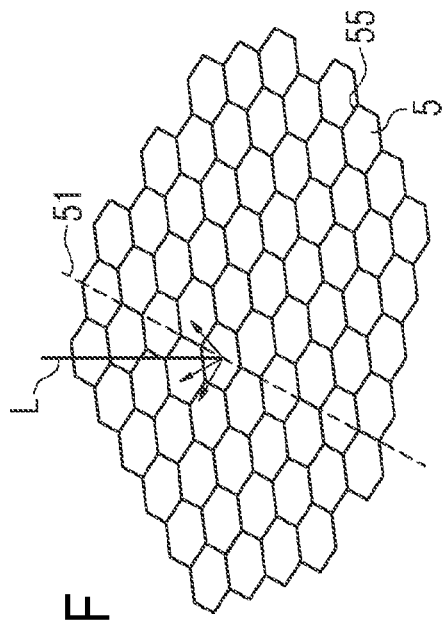

FIG. 1F shows the sacrificial layer 5 in top view. It can be seen that the singulation lanes 55 are formed by regular hexagons. Thus the finished semiconductor chips 1 have a hexagonal base when viewed from above.

FIG. 1F also shows an example of a single singulation line 51 along which the laser radiation L is guided. The singulation line 51 runs section by section through the singulation lanes 55 and section by section over the remaining areas of the sacrificial layer 5. The carrier substrate 4 is divided exclusively in the singulation lanes 55. The sacrificial layer 5 itself is not transmissive to the laser radiation L.

The laser radiation L is accordingly moved along several straight singulation lines 51, so that all singulation lanes 55 are completely traversed one after the other and singulation takes place. In contrast to FIG. 1D, a further carrier is preferably present, which can be located on a side of the semiconductor layer sequence 2 and/or the growth substrate 3 facing away from the carrier substrate 4.

Figure 1G:
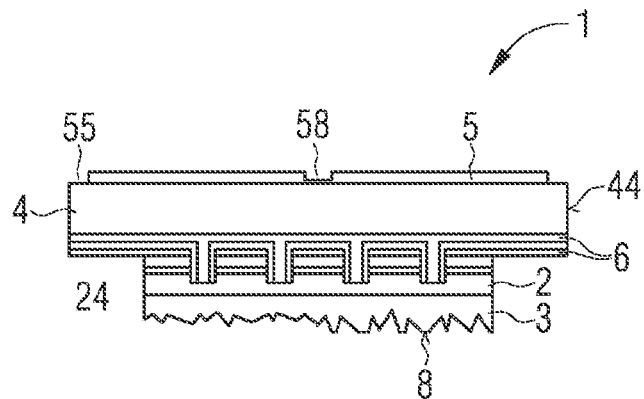

A finished semiconductor chip 1 is shown in FIG. 1G. The singulation produces carrier side surfaces 44 of carrier substrate 4. The sacrificial layer 5 is set back from the carrier side surfaces 44, as are side surfaces 24 of the semiconductor layer sequence 2. Alternatively, the sacrificial layer 5 can be flush with the carrier side surfaces 44.

Because the singulation lines 51 run in places over the sacrificial layer 5, a groove 58 is formed in the sacrificial layer 5. The groove 58 runs along a straight line and only partially penetrates the sacrificial layer 5.

Figure 5A:
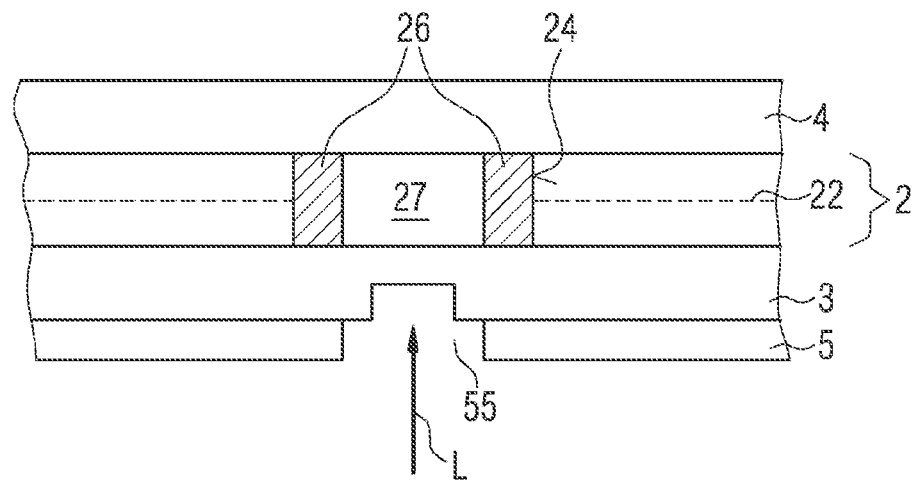
Figure 5B:
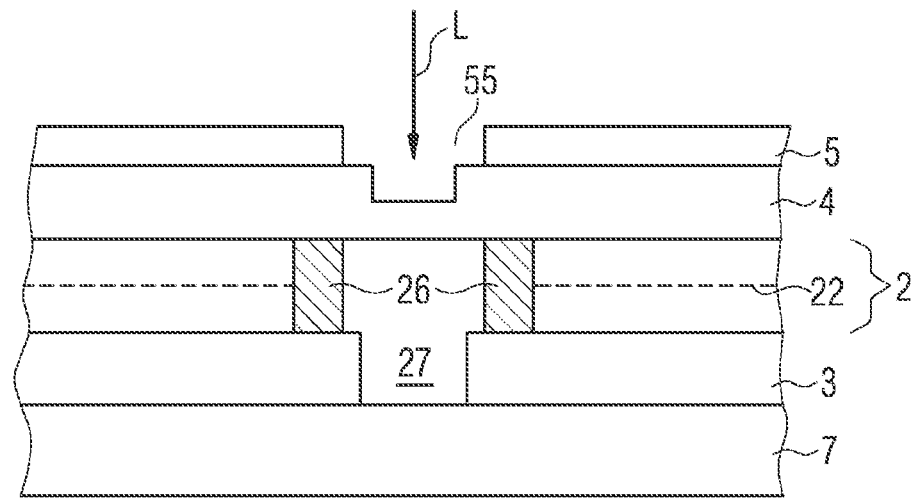
Figure 6:
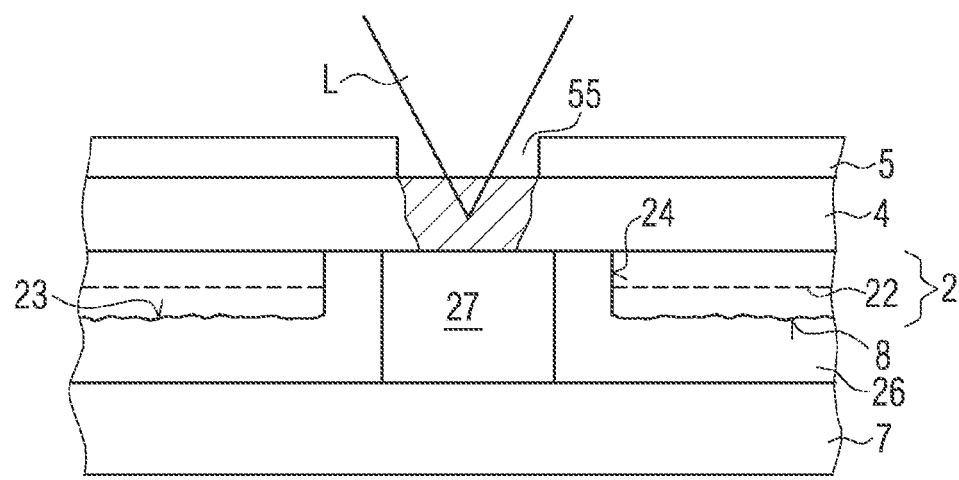

The semiconductor layer sequence 2 together with the contact structures 6 is designed, for example, as illustrated in the publication US 2013/0221392 A1, see FIGS. 2 and 5 and 6 in particular. Furthermore, the semiconductor layer sequence 2 can be designed with the contact structures 6, as described in the publication US 2011/0260205 A1, see FIG. 1 in particular, whereby an ESD protection unit can be omitted. The disclosure content of these publications with regard to the semiconductor layer sequence 2 and the contact structures 6 is incorporated by reference.

As an alternative to a molybdenum layer, the sacrificial layer 5 can be a solder layer intended for fastening the semiconductor chip 1. When fastening, the sacrificial layer 5 preferentially melts, so that the groove 58 is no longer present in the mounted semiconductor chip 1.

Figure 2A:
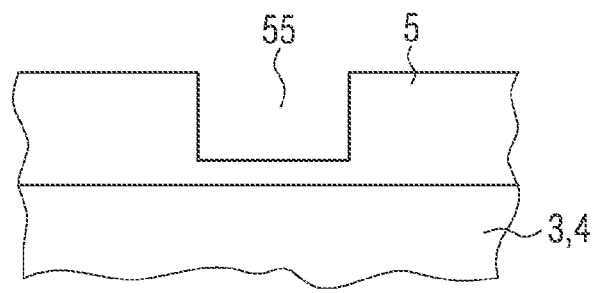
FIGS. 2A-2B show schematic sectional views of singulation lanes for exemplary embodiments of methods.

FIG. 2 illustrates further possible designs of the sacrificial layer 5 in the area of the singulation lanes 55, which may also apply in all other exemplary embodiments. According to FIG. 2A, the sacrificial layer 5 in the singulation lanes 55 is not completely removed, but only predominantly. This protects the growth substrate 3 and/or the carrier substrate 4. In particular, the growth substrate 3 and/or the carrier substrate 4 can thus be protected from an etching agent for structuring the sacrificial layer 5.

Figure 2B:
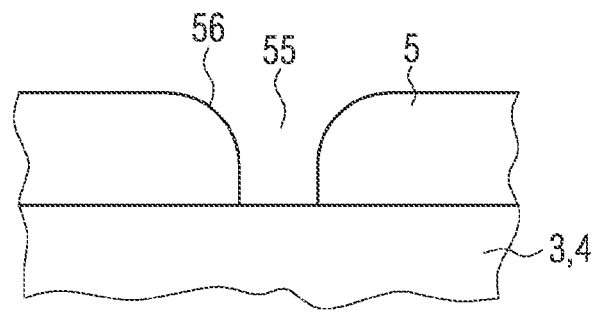

FIG. 2B illustrates that there is a curvature 56 at each edge of the singulation lanes 55. The curvature 56 is convex. Due to such a curvature 56, the laser radiation L is subjected to a comparatively large scattering when leaving the singulation lanes 55, so that the semiconductor layer sequence 2 can be protected from scattered radiation of the laser radiation L.

Figure 3A:
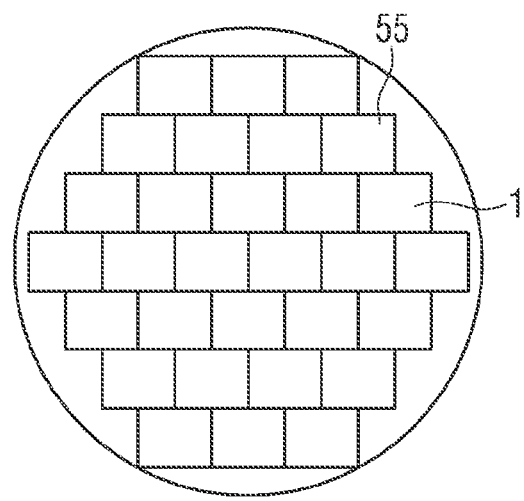
FIGS. 3A-3B show schematic top views of separation lanes for exemplary embodiments of methods.

FIG. 3 illustrates further top views of the singulation lanes 55. In FIG. 3A, comparatively large rectangular semiconductor chips 1 are present, seen from above. The semiconductor chips 1 cannot be separated by straight cuts along at least one direction. Seen from above, the semiconductor chips 1 are arranged similar to a brick wall, also known as chip bricking. The method described here makes it possible to efficiently singulate such semiconductor chips 1.

Figure 3B:
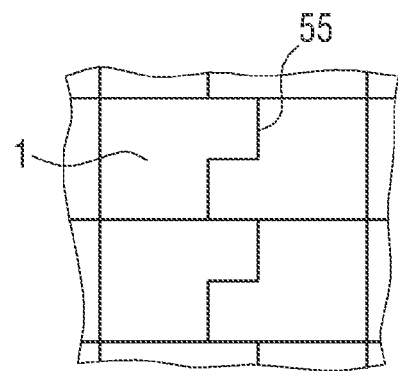

In the exemplary embodiment shown in FIG. 3B, the semiconductor chips 1 have a hexagonal shape when viewed from above, with the semiconductor chips 1 being L-shaped. Even such more complex shapes can be efficiently generated with the help of the singulation lanes 55.

Figure 4:
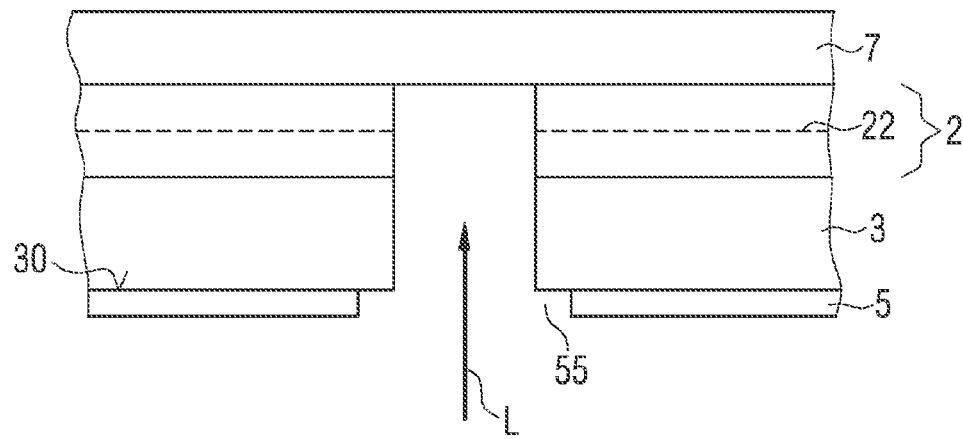

Deviating from FIG. 1, dividing according to FIG. 4 does not take place in carrier substrate 4, but in the growth substrate 3 itself. Thus the sacrificial layer 5 with the singulation lanes 55 is located on an outer side 30 of the growth substrate 3 facing away from the semiconductor layer sequence 2. The semiconductor layer sequence 2 itself can also be divided by the laser radiation L. A further carrier 7 is preferably present for mechanical stabilization, which can be completely removed after dividing the semiconductor layer sequence 2 and the growth substrate 3.

In the method illustrated in FIG. 5, both the growth substrate 3 and the carrier substrate 4 are divided one after the other. In FIG. 5A, the growth substrate 3 is first divided via the sacrificial layer 5 in the singulation lanes 5. The semiconductor layer sequence 2 can already be structured in advance so that a free area 27 is formed below the singulation lanes 55.

Optionally, as in all other exemplary embodiments, the side surfaces 24 of the semiconductor layer sequence 2 can be provided with a protective layer 26. For example, the protective layer 26 is a silicon dioxide layer with a thickness of 400 nm, for example.

If the growth substrate 3 is divided, then, as shown in FIG. 5B, the further carrier 7 is preferably attached as a temporary carrier. Subsequently, the carrier substrate 4 is divided via the sacrificial layer 5, analogous to FIG. 1.

Deviating from the illustration in FIG. 5, it is possible that only a single sacrificial layer 5 is used, through whose separation lanes 55 both the growth substrate 3 and the carrier substrate 4 are divided. This can be done from the side of the growth substrate 3, whereby the further carrier 7 is then located on the carrier substrate 4. If the dividing occurs from the side of the carrier substrate 4, see FIG. 5B, the growth substrate 3 can also be divided after or with the dividing of the carrier substrate 4 via the sacrificial layer 5 shown in FIG. 5B.

As in all other exemplary embodiments, the dividing can partially reach into the further carrier 7, so that material removal and/or damage to the further carrier 7 by the laser radiation L is possible. Alternatively, the further carrier 7 remains unaffected by the dividing, for example, if the laser radiation L is relatively strongly focused and the further carrier 7 is comparatively far away from a focal plane of the laser radiation L.

According to FIG. 6, the laser radiation L is focused into an inner area of the carrier substrate 4. The focused laser radiation L causes material damage within the carrier substrate 4. As a result, the carrier substrate 4 has predetermined breaking points in the area of the laser radiation L or the laser-treated material can be selectively and efficiently etched. A wavelength of the laser radiation L preferably lies in a range for which the carrier substrate 4 is transparent. This means that the carrier substrate 4 can be divided by so-called stealth dicing. The area of material damage in the carrier substrate 4 caused by stealth dicing using the laser radiation L is symbolized by a hatching. Apart from laser ablation or laser evaporation, such splitting can also be used in all other exemplary embodiments of dividing the carrier substrate 4 and/or the growth substrate 3.

In addition, FIG. 6 illustrates that a temporary protective layer 26 is present, such as a photoresist. The protective layer 26 is applied both to the side surfaces 24 and to the underside 23 of the semiconductor layer sequence 2. By means of the protective layer 26, it is also possible to connect the further carrier 7 with the semiconductor layer sequence 2. Differences in height or variations in thickness by the optional roughening 8 can be compensated by the material of the protective layer 26.

Unless otherwise indicated, the components shown in the figures follow each other directly in the order given. Layers that do not touch each other in the figures are preferably spaced apart. As far as lines are drawn parallel to each other, the corresponding surfaces are preferably aligned parallel to each other as well. Also, unless otherwise indicated, the relative positions of the drawn components to each other are correctly reproduced in the figures.

The invention described here is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. A method for producing optoelectronic semiconductor chips, the method comprising:
   growing a semiconductor layer sequence with an active zone for radiation generation onto a growth substrate;
   attaching a carrier substrate;
   depositing a sacrificial layer on an outer side of the carrier substrate and/or of the growth substrate which faces away from the semiconductor layer sequence;
   structuring the sacrificial layer so that singulation lanes are formed; and
   dividing the carrier substrate and/or the growth substrate along the singulation lanes by a singulation stream comprising a laser radiation or a plasma,
   wherein the sacrificial layer adjacent to the singulation lanes is not transmissive to the singulation stream, and
   wherein the singulation stream is passed both through the singulation lanes and over the sacrificial layer.

2. The method according to claim 1, wherein the singulation stream comprises a plurality of partial beams, all the partial beams being guided directly successively along a straight singulation line over the sacrificial layer and the singulation lanes so that dividing along the respective singulation line takes place only by interaction of all the partial beams.

3. The method according to claim 1, wherein the sacrificial layer is a metallic layer comprising Mo, Al and/or a solder.

4. The method according to claim 1, wherein a thickness of the sacrificial layer is between 2 μm and 50 μm inclusive.

5. The method according to claim 1,
   wherein depositing the sacrificial layer comprises applying the sacrificial layer with a constant thickness throughout,
   wherein structuring comprises removing the sacrificial layer in a region of the singulation lanes to at least 90%, and
   wherein dividing comprises thinning the sacrificial layer in places adjacent to the singulation lanes.

6. The method according to claim 1,
   wherein at least some of the singulation lanes have several bends when viewed from above, and
   wherein the optoelectronic semiconductor chips are polygons with at least five corners when viewed from above.

7. The method according to claim 1, wherein dividing comprises dividing the growth substrate and/or the carrier substrate to at least 85% by the singulation stream.

8. The method according to claim 1, wherein an edge of the singulation lanes has at least one rounding so that the singulation stream is at least partially dispersed when leaving the singulation lanes.

9. The method according to claim 1,
   wherein electrical contact structures for making electrical contact with the optoelectronic semiconductor chips are located on an inner side of the carrier substrate facing the semiconductor layer sequence, and
   wherein dividing comprises dividing the electrical contact structures by the singulation stream.

10. The method according to claim 1, further comprising:
    patterning the semiconductor layer sequence and the growth substrate prior to dividing, wherein the carrier substrate is a permanent carrier of the optoelectronic semiconductor chips, and wherein the carrier substrate is divided by the laser radiation.

11. The method according to claim 10, further comprising:

applying at least one protective layer to at least side surfaces of the semiconductor layer sequence before dividing, wherein a region directly below the singulation lanes remains free of the protective layer.

12. The method according to claim 1, wherein, when viewed from above, a lateral distance of the semiconductor layer sequence from the singulation lanes is at least 120% of an average width of the singulation lanes.

13. The method according to claim 1, wherein the growth substrate and/or the carrier substrate are of one or more of silicon, germanium, sapphire, glass, or ceramic.

14. The method according to claim 1, further comprising completely removing the sacrificial layer from the carrier substrate and/or from the growth substrate after dividing.

15. An optoelectronic semiconductor chip produced by the method according to claim 1, the optoelectronic semiconductor chip comprising:

the semiconductor layer sequence having the active zone;

the carrier substrate on which the semiconductor layer sequence is located; and the sacrificial layer on the outer side of the carrier substrate facing away from the semiconductor layer sequence, wherein the sacrificial layer and the semiconductor layer sequence are set back in a cross-section with respect to carrier side surfaces of the carrier substrate, and wherein the sacrificial layer has at least one groove which only partially penetrates the sacrificial layer in a direction towards the carrier substrate and which completely crosses the sacrificial layer when viewed from above.

16. The optoelectronic semiconductor chip according to claim 15, wherein the optoelectronic semiconductor chip is surface mountable, and wherein the sacrificial layer is a solder for fastening the optoelectronic semiconductor chip.

17. The optoelectronic semiconductor chip according to claim 15, wherein the optoelectronic semiconductor chip is a polygon with at least five corners when viewed from above.

18. The optoelectronic semiconductor chip according to claim 15, wherein electrical contacts for making electrical contact with the optoelectronic semiconductor chip are located on an inner side of the carrier substrate facing the semiconductor layer sequence.

19. The optoelectronic semiconductor chip according to claim 15, wherein the carrier substrate comprises silicon, germanium, sapphire, glass, or ceramic.

20. The optoelectronic semiconductor chip according to claim 15, wherein the sacrificial layer is a metallic layer comprising Mo, Al and/or a solder.

* * * * *